United States Patent [19]

Lawrence et al.

[11] Patent Number: 4,495,514

[45] Date of Patent: Jan. 22, 1985

[54] TRANSPARENT ELECTRODE LIGHT EMITTING DIODE AND METHOD OF MANUFACTURE

[75] Inventors: David J. Lawrence, Rochester; Daniel C. Abbas, Webster; Daniel J. Phelps, Rochester; Frank T. J. Smith, Fairport, all of N.Y.

[73] Assignee: Eastman Kodak Company, Rochester, N.Y.

[21] Appl. No.: 517,568

[22] Filed: Jul. 28, 1983

Related U.S. Application Data

[63] Continuation of Ser. No. 239,798, Mar. 2, 1981.

[51] Int. Cl.$^3$ ............... H01L 27/12; H01L 33/00; H01L 23/48; H01L 29/40
[52] U.S. Cl. .......................................... 357/67; 357/4; 357/17; 357/65
[58] Field of Search ............... 357/15, 16, 17, 65, 357/67, 2, 4

[56] References Cited

U.S. PATENT DOCUMENTS

| | | | |
|---|---|---|---|
| 3,684,930 | 8/1972 | Collins et al. | 357/67 |
| 3,849,707 | 11/1974 | Braslau et al. | 357/17 |
| 3,864,720 | 2/1975 | Merrin | 357/17 |
| 3,871,008 | 3/1975 | Debesis | 357/68 |
| 3,871,016 | 3/1975 | Debesis | 357/68 |
| 3,889,286 | 6/1975 | Debesis | 357/67 |
| 3,909,929 | 10/1975 | Debesis | 357/68 |
| 4,011,583 | 3/1977 | Levinstein et al. | 357/67 |
| 4,012,767 | 3/1977 | Brown et al. | 357/71 |
| 4,064,521 | 12/1977 | Carlson | 357/2 |
| 4,153,905 | 5/1979 | Charmakadze et al. | 357/17 |
| 4,158,849 | 6/1979 | Harwylo | 357/17 |
| 4,197,552 | 4/1980 | Walker et al. | 357/4 |
| 4,291,323 | 9/1981 | Bachmann | 357/67 X |
| 4,360,564 | 11/1982 | Philipp | 357/4 |
| 4,376,285 | 3/1983 | Leonberger et al. | 357/16 |
| 4,414,561 | 11/1983 | Keramidas et al. | 357/67 |

OTHER PUBLICATIONS

D. B. Fraser and H. D. Cook, "Highly Conductive, Transparent Films of Sputtered $In_{2-x}Sn_xO_{3-y}$", J. Electrochem. Soc.: Solid-State Science and Technology, vol. 119, No. 10, Oct. 1972, pp. 1368–1374.

J. L. Vossen, "RF Sputtered Transparent Conductors The System $In_2O_3$–$SnO_2$", RCA Review, vol. 32, Jun. 1971, pp. 289–296.

V. L. Rideout, "A Review of the Theory and Technology for Ohmic Contacts to Group III–V Compound Semiconductors", Solid-State Electronics, vol. 18, (1975), pp. 541–550.

Primary Examiner—Andrew J. James
Assistant Examiner—J. Carroll
Attorney, Agent, or Firm—Raymond L. Owens

[57] ABSTRACT

An efficient light emitting diode is disclosed wherein the spatial distribution of emitted radiation is highly uniform. In accordance with the present invention, a transparent electrode is used to couple current to the light emitting diode junction in a manner that minimizes the resistance at the interface between the transparent electrode and semiconductor diode material. Specifically, it has been found that the interface resistance is significantly reduced, and device efficiency thus increased, by forming a thin metal-based layer at such interface and/or by annealing the transparent electrode after formation on the device.

2 Claims, 10 Drawing Figures

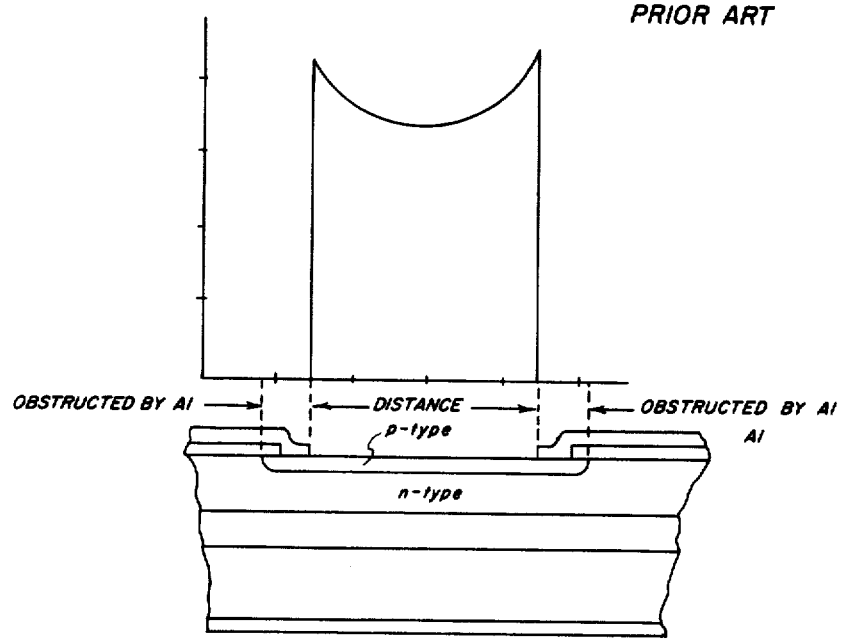
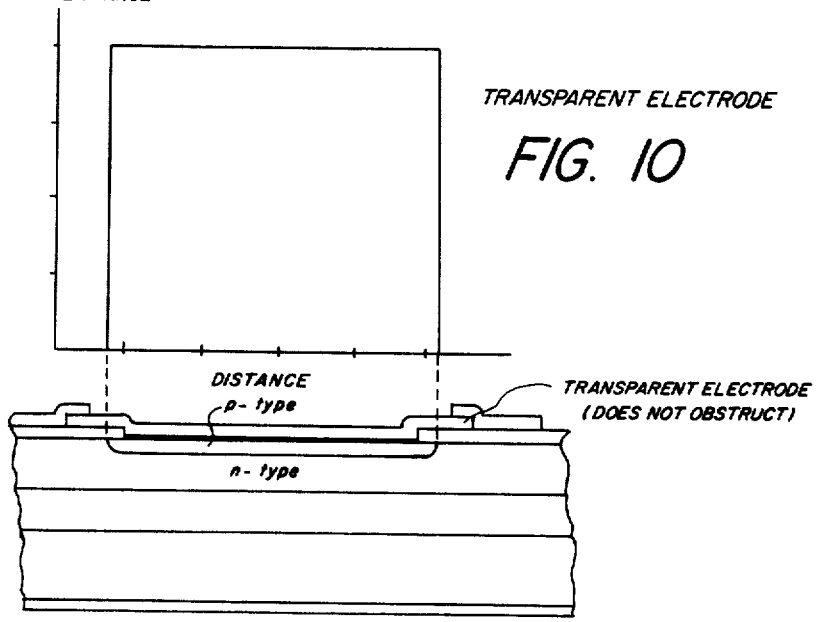

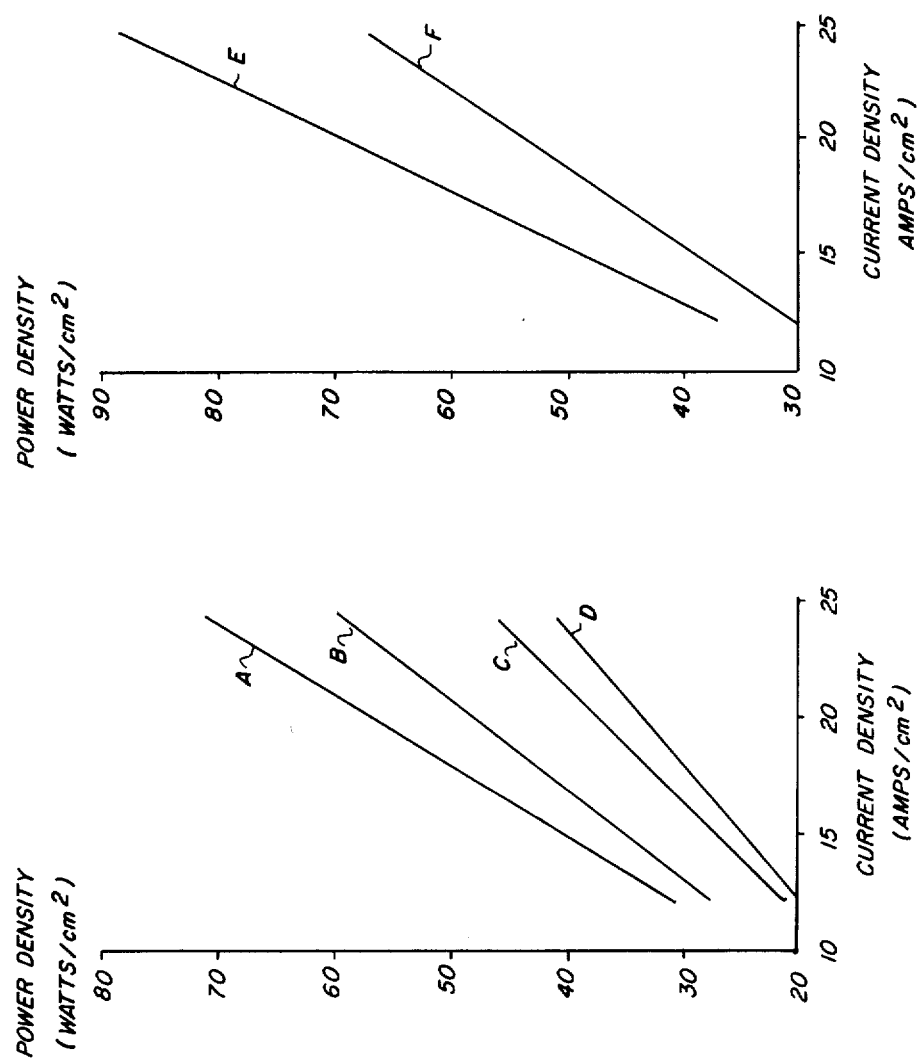

FIG. 9
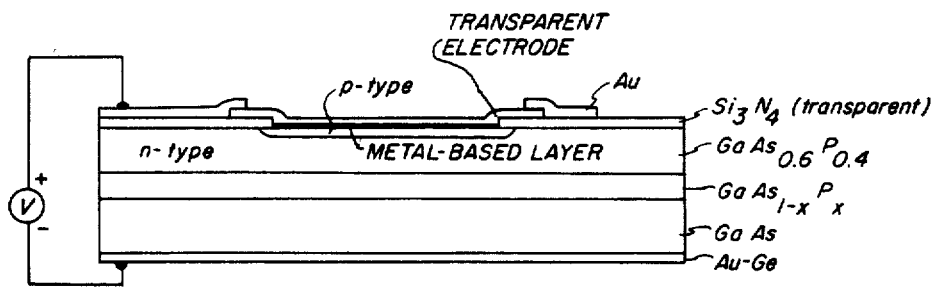
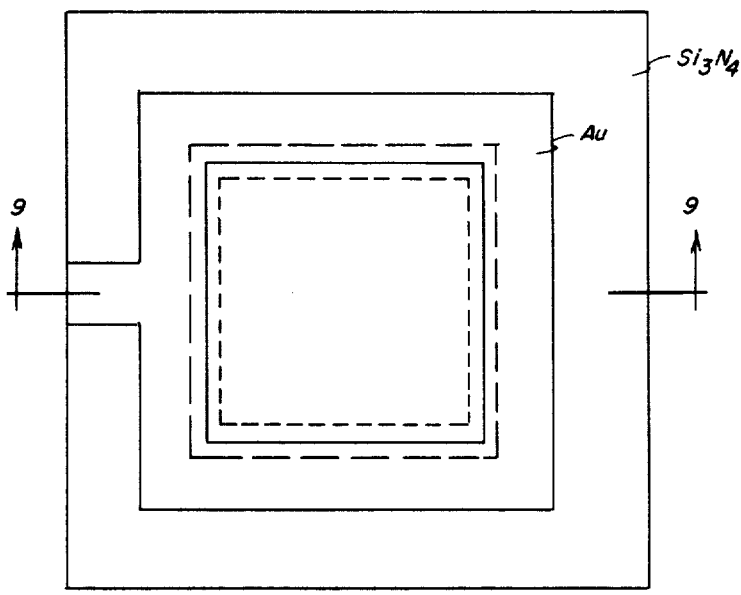
FIG. 8

TRANSPARENT ELECTRODE LIGHT EMITTING DIODE AND METHOD OF MANUFACTURE

This is a continuation of application Ser. No. 239,798, filed Mar. 2, 1981.

FIELD OF THE INVENTION

The present invention relates to light emitting diodes and, more particularly, to light emitting diodes having transparent electrodes.

DESCRIPTION RELATIVE TO THE PRIOR ART

The term "light emitting device" is used throughout this specification to refer to a semiconductor device that emits radiation in the optical spectrum (e.g., infrared through ultraviolet) in response to an applied current from an external power source. The most commonly known type of light emitting device is the light emitting diode. Basically, the light emitting diode is a semiconductor p-n junction which, when forward biased by an external power source, emits optical radiation as electrons and holes recombine in the vicinity of the junction. The light emitting diode is an attractive source of optical radiation because it is highly efficient, reliable and inexpensive. As a result, the light emitting diode has found widespread commercial use as a miniature lamp (e.g., the "on-off" light in electrical equipment) and as a display device in calculators, watches, etc.

In order to couple current to the p-n junction, a metal electrode is formed which partially overlaps the p-n junction area. Because metal is opaque to optical radiation, however, no light can be emitted from those areas of the p-n junction that are obstructed by the metal electrode. This is particularly disadvantageous because the amount of optical radiation produced per unit area at the p-n junction is a maximum in those areas of the p-n junction which are obstructed by the metal electrode.

From the standpoint of maximizing the amount of useful optical radiation, therefore, it is desirable to minimize the area of overlap of the metal electrode with the p-n junction. The area of metal overlap, however, cannot be made arbitrarily small for two reasons: (1) Decreasing the area of metal overlap results in an increased current density flowing from the metal electrode to the p-n junction which, if large enough, will destroy the device. (2) The resistance of the electrical contact between the electrode and p-n junction increases as the area of overlap is made smaller, thereby reducing the efficiency of the device.

In the larger types of typical commercially available light emitting diodes the loss in efficiency due to metal obstruction, while significant, is not severe. One reason is that the area of metal obstruction tends to be small relative to the active p-n junction area. A second reason is that the surface layer of the semiconductor material contacting the metal electrode generally has a low sheet resistance. As a result, current from the metal electrode tends to spread laterally across the active p-n junction area. (Sheet resistance is defined for a planar wafer of material as the bulk resistivity of the material divided by its thickness, and is thus a measure of how easily current can spread laterally through the material.) Optical radiation thus tends to be produced throughout the active area of the p-n junction (although not uniformly, as discussed below) and the amount lost due to metal obstruction represents a relatively small percentage. In very small area light emitting diodes, however, the loss in optical radiation due to metal obstruction can be quite severe, exceeding 50 percent, as the active area of the p-n junction becomes smaller relative to the obstructed area.

In a related type of light emitting device known as an electroluminescent phosphor device, it is common practice to use a transparent electrode to supply current to the device. As a result of the use of a transparent electrode, there is no loss in efficiency due to partial obstruction of the active area of the device. (Some loss in efficiency due to the electrode is still present, however, due to the less than perfect optical transmissivity of the transparent electrode.) It has also been suggested that transparent electrodes (made of indium tin oxide) be used in connection with light emitting diodes. See U.S. Pat. No. 4,012,767 at column 7, lines 38 to 46.

The use of transparent electrodes on light emitting diodes has been suggested in U.S. Pat. No. 4,012,767 and appears plausible based on the widespread use of such electrodes in the field of electroluminescent phosphor devices. It has been found, however, that the application of transparent electrodes to light emitting devices is not a straightforward or simple matter. For example, while it would be expected that the use of a transparent electrode on a light emitting device would lead to an improved efficiency, it has been found that the opposite is true; namely, the resulting light emitting diode is substantially less efficient than a similar device having a metal electrode.

SUMMARY OF THE INVENTION

In accordance with the present invention, a light emitting diode structure is provided which, although incorporating a transparent electrode, is highly efficient. Specifically, it has been found that the efficiency of a transparent electrode light emitting diode can be significantly improved by forming a thin metal-based layer at the interface between the transparent electrode and semiconductor diode structure, and/or by annealing of the transparent electrode after formation. The resulting light emitting diode structure and method for making such are discussed in more detail below.

BRIEF DESCRIPTION OF THE DRAWINGS

In the detailed description of the preferred embodiments of the invention presented below, reference is made to the accompanying drawings, in which:

FIG. 3 is a diagram illustrating certain radiometric properties of the metal electrode light emitting diode shown in FIGS. 1 and 2;

FIGS. 6 and 7 are graphs which illustrate certain advantages obtained by practicing the invention;

FIG. 8 is a plan view of a transparent electrode light emitting diode in accordance with the present invention;

FIG. 9 is a sectional view taken along line 9—9 of the light emitting diode shown in FIG. 8; and FIG. 10 is a diagram which shows certain radiometric properties of the light emitting diode shown in FIGS. 8 and 9.

DETAILED DESCRIPTION OF THE PREFERRED EMBODIMENTS

Figure 2:
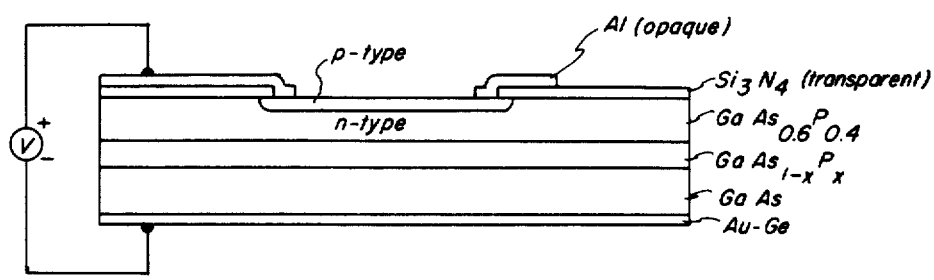
FIG. 2 is a sectional view taken along line 2—2 of the light emitting diode shown in FIG. 1.
Figure 1:
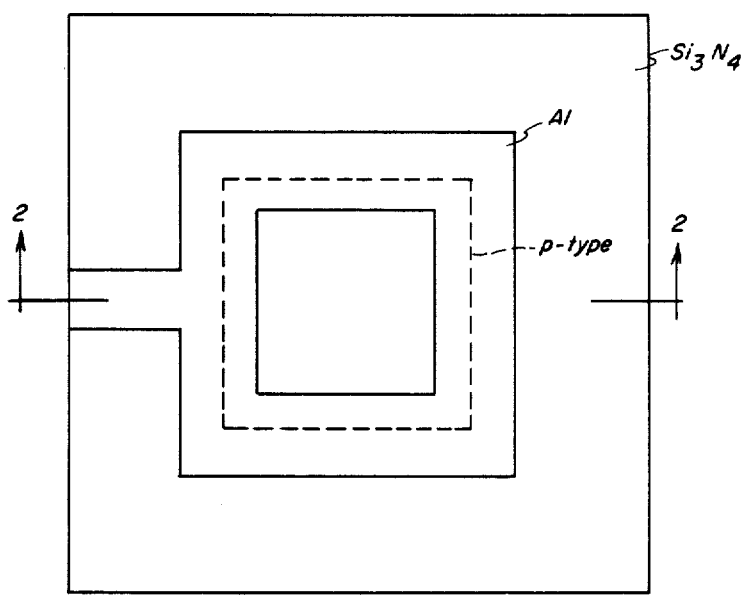
FIG. 1 is a plan view of a prior art metal electrode light emitting diode.

FIGS. 1 and 2 show the construction of a prior art metal electrode light emitting diode wherein the p-n junction is formed in a layer of $GaAs_{0.6}P_{0.4}$ (gallium arsenide phosphide). The $GaAs_{0.6}P_{0.4}$ layer overlies a graded layer of $GaAs_{1-x}P_x$ that is grown by standard vapor phase epitaxy on a GaAs (gallium arsenide) substrate. The alloy composition of the $GaAs_{1-x}P_x$ layer changes from $x=0$ (matching the GaAs substrate layer) to $x=0.4$ (matching the $GaAs_{0.6}P_{0.4}$ diode layer). A film of $Si_3N_4$ (silicon nitride) is deposited over the $GaAs_{0.6}P_{0.4}$ layer by standard chemical vapor deposition techniques. A window is then etched by photolithographic techniques in the $Si_3N_4$ film, after which a p-type region is diffused in the n-type layer of $GaAs_{0.6}P_{0.4}$. Photolithographic techniques are then used to pattern a metal electrode, shown in FIGS. 1 and 2 as being comprised of aluminum. As electrical connection is provided to the GaAs substrate by a metal electrode comprised, for example, of alloyed gold-germanium (Au-Ge) or gold-tin (Au-Sn).

As discussed above, optical radiation is produced at the p-n junction upon the application of a forward bias voltage V. Not all of this radiation, however, will be emitted from the device. For example, in the case of the device shown in FIGS. 1 and 2, radiation produced in areas of the p-n junction which underlie the aluminum electrode will be lost as useful radiation because such areas are obstructed by the opaque (aluminum) electrode. FIG. 3 shows a plot of the radiant exitance (i.e., the radiant power per unit area) produced by the metal electrode light emitting diode described above in connection with FIGS. 1 and 2. As noted above, light produced in those regions of the p-n junction which underlie the metal electrode cannot escape from the device because the metal electrode is opaque to optical radiation. The overall effect of such obstruction is thus to reduce the efficiency of the device by an amount dependent upon the amount of radiation obstructed by the metal electrode.

FIG. 3 also illustrates the non-uniformity in light output produced by a metal electrode light emitting diode. The distribution of current flowing laterally away from the electrode is determined by the sheet resistance of the p-type region and the current voltage characteristics of the p-n junction. Typically, such sheet resistance is about 15 to 100 ohms per square ($\Omega/\square$). Because of the current-voltage characteristics of the p-n junction (i.e., a small percentage decrease in voltage causes a large percentage decrease in current), these values of sheet resistance of the p-type region lead to a rapid decrease in the junction current density with lateral distance from the electrode. Thus, the current tends to bunch in those regions of the p-n junction which are proximate the metal electrode. This phenomenon is referred to hereinafter as "current bunching." Because the light output is proportional to the number of electrons and holes which recombine and emit radiation, light output will vary in proportion to the current density over the usual operating range of most light emitting diodes. As a result, the radiant exitance in the center region of the p-n junction will be less, where the current density is relatively low, than the radiant exitance emitted in regions proximate the metal electrode where the current density is relatively large. For large area light emitting diodes, the non-uniformity in light output is most severe because the current has to travel farther from the electrode to reach the center of the diode than it does for a small area device.

Figure 4:
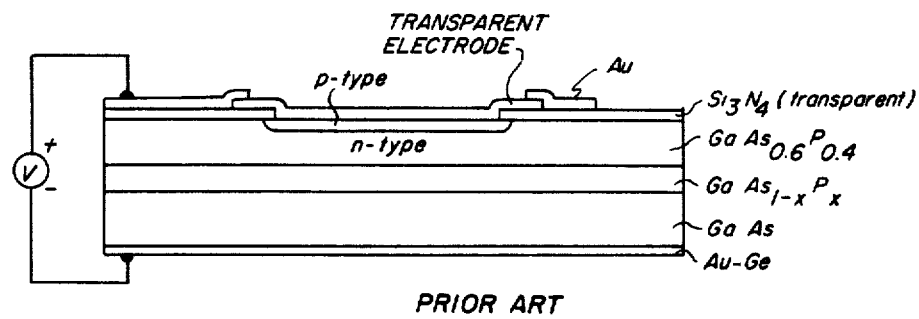
FIG. 4 is a sectional view of a light emitting diode having a transparent electrode.

FIG. 4 shows a light emitting diode having a transparent electrode comprised of indium tin oxide that overlies the p-n junction area and makes electrical contact with the surface (p-type) material. As discussed above, it would be expected that the use of a transparent electrode in a light emitting diode as shown in FIG. 4 would result in an improved efficiency since no part of the active p-n junction area is obstructed by an opaque electrode. It has been found, however, that the transparent electrode light emitting diode shown in FIG. 4 is substantially less efficient than the metal electrode device described above in connection with FIGS. 1, 2 and 3. The source of this decrease in efficiency has been determined to be caused by a relatively large contact resistance produced at the interface between the indium tin oxide electrode and the p-type region of the semiconductor diode material. More specifically, the cause is believed to lie at least partially in the fact that indium tin oxide is an n-type semiconductor material and thus forms an additional diode structure (between the transparent electrode and p-type region) apart from the p-n light emitting junction. Because of the polarities involved, forward biasing the light emitting diode causes the diode formed by the transparent electrode and p-type region to be reversed biased. As a result, the interface between the transparent electrode and p-type region has a resistance which is comparable to or greater than the effective resistance of the light emitting junction. A substantial amount of power which is not effective in producing optical radiation is thus dissipated at the interface between the transparent electrode and the p-type material.

The large interface resistance discussed above will occur in materials other than indium tin oxide because many materials useful as transparent electrodes exhibit semiconductor properties. As a result, a heterojunction will be formed between the transparent electrode material and the adjacent semiconductor material (whether it be p-type or n-type), thereby giving rise to a high electrical resistance at the interface. In addition, depending on the type of material used for the transparent electrode and its method of deposition, a layer of electrically insulating oxide may be formed at the interface. For example, if the transparent electrode is comprised of a metal oxide having a lower oxidation potential than the semiconductor diode material, a layer of insulating oxide may be formed which will greatly increase the junction resistance.

In accordance with the present invention, the interface resistance between a metallic oxide electrode and a semiconductor is significantly reduced by forming a thin, metal-based layer at the interface, and/or by annealing the transparent electrode after its formation on the device. As used hereinafter, the term "metallic oxide" is not restricted to chemically pure metallic oxide but, rather, includes metallic oxide having added impurities. As will be apparent from the discussion which follows, the term "metal-based layer" refers to a metal layer and/or a metal layer which has been oxidized. It has been found that the metal-based layer can be made thin enough to be optically transmissive, while still having the effect of substantially reducing the interface resistance. In this respect, metal-based layers having thicknesses less than about 200 angstroms are useful, while thicknesses between 15 and 100 angstroms are preferred.

Figure 5:
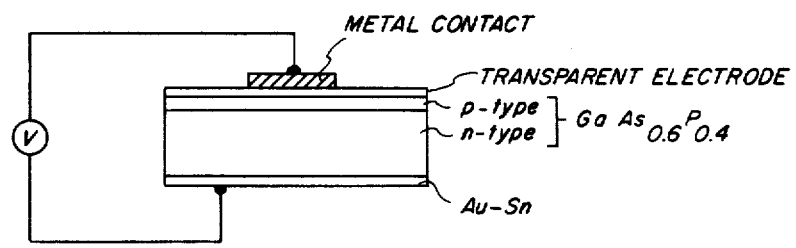
FIG. 5 is a sectional view of a light emitting diode structure used for making the electrical measurements set forth in the Examples below.

In order to demonstrate the increased efficiency obtained by practicing the invention, the GaAs$_{0.6}$P$_{0.4}$ diode structure shown in FIG. 5 was used as a test structure to produce the results given in the following comparative examples.

EXAMPLE 1

Prior Art

In order to illustrate the advantages obtained by practicing the invention, a transparent electrode comprised of cadmium tin oxide was deposited on the cleaned and etched GaAs$_{0.6}$P$_{0.4}$ diode surface. The applied voltage was varied and measurements of the current density through the device were taken. From this data, the power per unit area (in watts per centimeter squared) that was dissipated by the device was calculated from the relation P=VI. Curve A of FIG. 6 shows how the power per unit area dissipated by the device varies with the current density through the device.

EXAMPLE 2

In accordance with the present invention, a 30 angstrom thick metal layer of chromium was formed on the GaAs$_{0.6}$P$_{0.4}$ diode surface before deposition of a cadmium tin oxide transparent electrode. After electrode deposition, the structure was annealed at 300° C. for one minute. It is believed that the chromium is oxidized during the above process to form a metal-based layer comprised of chromium and chromium oxide having a thickness of about 60 angstroms. The same electrical measurements were taken as in Example 1. Curve B of FIG. 6 shows the power per unit area dissipated by this device as a function of current density through the device.

A comparison of curve A with curve B shows that for a given current density less power is dissipated by the device. Because the optical radiation produced at the junction of the device is proportional to current density passing therethrough, these curves indicate the less power is required for the Example 2 device to produce the same amount of optical radiation as the Example 1 device. The Example 2 device of the present invention is, therefore, substantially more efficient than the Example 1 device.

EXAMPLE 3

In accordance with the invention, a light emitting diode structure was prepared as in Example 2 except that annealing was performed at 300° C. for five minutes (instead of one minute). Curve C shows the resulting power dissipated per unit area as a function of current density. As is seen from a comparison of curves B and C, the additional annealing time results in a further decrease in the power required to produce a given amount of optical radiation.

EXAMPLE 4

In accordance with the present invention a light emitting diode structure was prepared as in Example 2 except that a gold-zinc alloy was used in place of chromium for the thin metal layer between the transparent cadmium tin oxide electrode and GaAs$_{0.6}$P$_{0.4}$ diode surface. In this case, it is believed that the resulting metal-based layer is comprised of the gold-zinc alloy as well as some zinc oxide. Curve D shows the resulting power dissipated per unit area as a function of current density. It is seen from a comparison of curves B, C and D that the use of a metal layer comprised of a gold-zinc alloy in place of a chromium metal layer results in an even more efficient device, even though annealing was only carried out for one minute.

EXAMPLE 5

Prior Art

A light emitting diode structure was prepared as in Example 1 using indium tin oxide as the transparent electrode material instead of cadmium tin oxide. Curve E of FIG. 7 shows the resulting power dissipated per unit area as a function of current density.

EXAMPLE 6

In accordance with the invention, the light emitting diode structure of Example 5 was annealed using scanned argon ion laser radiation having a radiant power of 0.6 watts. The laser beam spot size was 10 microns and the scan rate was 10 cm/sec. Curve F shows the resulting power dissipated per unit area as a function of current density. As is seen from a comparison of curves E and F, substantially less power is required to produce the same amount of optical radiation from the annealed device of this example than from the device of Example 5.

The above examples indicate that when a transparent electrode comprised of a metallic oxide is merely deposited on the semiconductor surface of a light emitting diode, substantial power is dissipated at the electrode-semiconductor interface due to the resulting interface resistance. In addition to representing a decrease in efficiency, the power dissipated at the electrode-semiconductor interface is also a problem in that it is dissipated as heat. For many applications of light emitting diodes, this additional and substantial heat build-up cannot be tolerated.

FIGS. 8 and 9 show a light emitting diode structure in accordance with one embodiment of the invention. While the device shown in these figures and the device shown in FIG. 4 both incorporate transparent electrodes, the device of FIGS. 8 and 9 also includes a thin, metal-based layer between the transparent electrode and the semiconductor material. The purpose of this metal-based layer, as illustrated in the examples, is to reduce the contact resistance at the electrode-semiconductor interface. As discussed above, the metal-based layer is sufficiently thin to be transmissive to optical radiation. It is apparent from FIGS. 8 and 9 that none of the active p-n junction area is optically obstructed. (A metal electrode comprised, for example, of gold (Au) is used to make electrical contact with the transparent electrode, but it does so in regions which do not overlie the p-n junction area.)

It is desirable that the transparent electrode have certain optical and electrical properties. The transparent electrode should have a low optical absorption coefficient at the wavelength of radiation that is emitted by the device. The absorption coefficient is defined for a particular material by the relation $T=e^{-\alpha x}$, where T is the optical transmissivity, x is the thickness of the material, and $\alpha$ is the absorption coefficient. See, for example, "Modern Optical Engineering", W. J. Smith, p. 146, McGraw-Hill Book Co. (1966). The absorption coefficient required will depend upon the particular application, although the optical efficiency of the device will be greater for lower values of the absorption coefficient. In most applications, it is contemplated that less than 10% of the radiation that is normally incident on the transmissive electrode will be absorbed thereby.

From an electrical standpoint, the uniformity of optical radiation emitted from the light emitting diode of the present invention is improved if the sheet resistance of the transparent electrode is less than about 5 ohms per square ($\Omega/\square$). The use of a transmissive electrode having this relatively low value of sheet resistance insures that the sheet resistance of the transmissive electrode will be substantially less than the resistance of the semiconductor material in contact therewith. If this condition is met, the transmissive electrode will have the effect of spreading a current applied thereto across the p-n junction, thereby substantially eliminating the phenomena of "current bunching" discussed above in connection with a metal electrode device. As a result, current passing through the p-n junction is more evenly distributed and the resulting light output more uniform.

The requirements of a low sheet resistance and a high transmissivity exclude the use of many, if not most, materials which are normally considered to be useful as "transparent electrodes". This is because the transmissivity of a layer is generally increased by reducing its thickness, but reducing the thickness of a layer will increase its sheet resistance. As a result, the requirements of a high transmissivity and a low sheet resistance tend to be incompatible. Materials which nevertheless have been identified as possessing these preferred electrical and optical properties are cadmium tin oxide, indium tin oxide, and indium oxide. Other materials believed to be useful as transparent electrodes include antimony oxide, antimony tin oxide, and various other oxides of tin.

FIG. 10 shows a plot of the radiant exitance distribution of the transparent electrode light emitting diode described in connection with FIGS. 8 and 9, assuming the use of one of the above-described preferred materials for the transparent electrode. Unlike the radiant exitance plot shown in FIG. 3 that corresponds to the metal electrode device, the radiant exitance of the transparent electrode device does not suffer from the obstruction of radiation emitted from any part of the p-n junction. (The Si$_3$N$_4$ layer does not obstruct radiation emitted at the p-n junction because it is optically transmissive.) In addition, the radiant exitance across the p-n junction area is highly uniform, a result of the current spreading which occurs due to the use of a transparent electrode having a low sheet resistivity.

It will be apparent to those skilled in the art that the present invention is useful in connection with semiconductor light detection devices as well as light emitting devices. Specifically, the techniques of the present invention can be applied to produce a low resistance contact between a transparent electrode and the semiconductor structure used for light detection. An example of such an application is the avalanche photodiode wherein a transparent electrode is used to apply an electric field across a semiconductor diode structure. A current is caused to flow through the diode in response to radiation passing through the transparent electrode and into the diode structure. The techniques of the present invention are directly applicable to reduce the resistance between the transparent electrode and semiconductor diode structure, thereby giving rise to a device of improved efficiency.

The use of a transparent electrode (on either a light emitting or light detecting device) is also advantageous because it can serve both an an electrode and an antireflection coating. It is well known, for example, that the efficiency loss due to Fresnel reflection at the device-air interface is about 30%, assuming the device has an index of refraction of about 3.6. Forming a transparent electrode having a thickness such that it reduces reflection at the device-air interface will thus lead to a substantial improvement in the device efficiency. The techniques associated with the formation of antireflection coatings are well known in the art and need not be discussed further.

The invention has been described in detail with particular reference to certain preferred embodiments thereof, but it will be understood that variations and modifications can be effected within the spirit and scope of the invention. For example, it will be apparent to those skilled in the art that the present invention is not limited to GaAsP light emitting diodes but, rather, has general applicability with all semiconductor light emitting diodes. It will also be apparent that in some cases, the processing steps may be such as to leave a metal-based layer between the transparent electrode and the adjacent semiconductor material that does not include a metal oxide but, rather, is comprised solely of the original metal material.

What is claimed is:

1. In a light emitting diode structure having a semiconductor light emitting surface, the improvement comprising a continuous transparent metal-based layer formed on said surface and having a thickness of between about 15 and 100 angstroms; and a transparent electrode formed on said metal-based layer and wherein such light emitting diode structure was annealed after formation of said transparent metal-based layer and said transparent electrode to reduce the resistance between said surface and such transparent electrode.

2. The invention as set forth in claim 1, wherein said metal-based layer is selected from the group consisting of chromium, a gold-zinc alloy, or oxides thereof and said transparent layer is a metallic oxide selected from the group consisting of cadmium tin oxide, indium tin oxide or indium oxide.

* * * * *